United States Patent [19]

Itabashi et al.

[11] Patent Number: 4,835,507
[45] Date of Patent: May 30, 1989

[54] PHOTOSENSOR ARRAY FOR IMAGE PROCESSING APPARATUS

[75] Inventors: Satoshi Itabashi, Atsugi; Tatsumi Shoji, Hiratsuka; Masaki Fukaya, Isehara, all of Japan

[73] Assignee: Canon Kabushiki Kaisha, Tokyo, Japan

[21] Appl. No.: 936,740

[22] Filed: Dec. 2, 1986

[30] Foreign Application Priority Data

Dec. 6, 1985 [JP] Japan ................. 60-274567

[51] Int. Cl.⁴ ............................. H01L 31/08
[52] U.S. Cl. ........................ 338/17; 338/15
[58] Field of Search ............ 338/15, 17; 430/60, 430/64

[56] References Cited

U.S. PATENT DOCUMENTS

| 4,405,915 | 9/1983 | Komatsu et al. | 338/15 |
| 4,471,042 | 9/1984 | Komatsu et al. | 430/64 |
| 4,650,984 | 3/1987 | Furushima et al. | 250/211 |

FOREIGN PATENT DOCUMENTS

| 53-0989 | 1/1978 | Japan | 338/15 |
| 56-92543 | 7/1981 | Japan . | |
| 56-116036 | 9/1981 | Japan . | |
| 58-182881 | 10/1983 | Japan | 338/15 |

OTHER PUBLICATIONS

F. Okamura, et al., "Amorphous Si: H Linear Image Sensor Operated by A-Si: H TFT Array"; Extended Abstracts of the 15th Conference on Solid State Devices and Materials, Tokyo, 1983, pp. 201–204.

Primary Examiner—Harold Broome
Assistant Examiner—M. M. Lateef
Attorney, Agent, or Firm—Fitzpatrick, Cella, Harper & Scinto

[57] ABSTRACT

A photosensor array for use with an image processing apparatus has a plurality of photosensors disposed in an array. Each photosensor includes a substrate, a photoconductive layer formed on the substrate and made of an amorphous silicon, and a pair of electrodes disposed on a surface of the photoconductive layer, the electrodes being spaced apart from each other by a certain distance partially defining a light receiving region of the photosensor. In the phososensor array, the photoconductive layer is constructed as of two or more laminated layers, and the lower layer positioned nearer to the substrate has a low content of oxygen.

7 Claims, 3 Drawing Sheets

PHOTOSENSOR ARRAY FOR IMAGE PROCESSING APPARATUS

BACKGROUND OF THE INVENTION

1. Field of the Invention

The present invention relates to a photosensor array for use with an image processing apparatus such as a facsimile, or a digital copying machine.

2. Related Background Art

It is well known to use a photosensor as a photoelectric conversion element in an image processing apparatus such as a facsimile, a digital copying machine, or a character reader. It is also known nowadays to use an elongated image sensor unit to read an image with high sensitivity. Such an elongated image sensor unit comprises an elongated photosensor array, a light source array for illuminating an original to be read, and an image focusing array for focusing the image of an original onto the elongated photosensor array which is constructed of photosensors disposed one-dimensionally. An example of such a photosensor array used in reading an image is known as a so-called sandwich-type photosensor which is constructed of a photoconductive layer containing such as amorphous silicon (hereinafter referred to as "a-Si"), with a pair of electrode layers being formed on opposite faces of the photoconductive layer. This type of photosensor picks up, as its signal output, primary photocurrent generated within the photoconductive layer upon reception of incident light. Thus, the output signal is relatively small. Further, since the electrode layers are disposed on opposite faces of the photoconductive layer of a photosensor, an electrical shortage may occur if pin holes are formed in the photoconductive layer during manufacturing.

To obviate the above problems, recently a so-called planar type photosensor has been used which has a pair of electrodes formed on a single face of the photoconductive layer containing such as an a-Si, the electrodes being spaced apart from each other by a distance partially defining the light receiving region. This type of photosensor picks up, as its signal output, secondary photocurrent generated in the photoconductive layer. Thus, the output signal is large relative to that of a sandwich-type photosensor.

Known methods of manufacturing an a-Si constituting such planar-type photosensors are the plasma CVD method, the reactive sputtering method, the ion plating method and the like. All these methods utilize glow discharge to accelerate reaction. It is necessary for all of these methods to use a relatively low discharge power in forming an a-Si film having a high photoconductivity and quality. Photoconductive layers obtained at a low discharge power, however, have poor adhesion to a substrate made of, for example, glass or ceramics, which results in a problem that the film is likely to be stripped off during a photolithography process for forming electrodes.

To prevent the film from being stripped off, a method has been heretofore adopted to deposit an a-Si film after making the surface of a substrate rough. Specifically, the surface of a substrate is made rough either chemically or mechanically, such as by using hydrofluoric acid or a brush.

With such a method, the roughness of the substrate is not uniform over the entire surface which has undergone a roughing treatment. Further, microscopic defects often exist locally on the substrate surface. Consequently, the characteristics of photosensor arrays often are quite diverse if they are manufactured in a manner similar to the conventional by depositing an a-Si film on the substrate and forming electrodes.

An elongated image sensor unit constructed of conventional photosensor arrays may produce bit signals of various amplitudes so that correction circuits for correcting such scattering become necessary, which results in a high cost of the sensor unit.

SUMMARY OF THE INVENTION

In view of the above-described problems, it is an object of the present invention to provide a photosensor array using planar-type photosensors, wherein each photosensor has an improved and uniform characteristic so that an elongated image sensor unit constructed of such photosensors produces bit signals of lesser scattering in amplitude and correction circuits for such scattering are not needed.

According to the present invention, there is provided a photosensor array for use with an image processing apparatus and having a plurality of photosensors disposed in an array, each photosensor including a substrate, a photoconductive layer formed on the substrate and made of an amorphous silicon, and a pair of electrodes disposed on a surface of the photoconductive layer, the electrodes being spaced apart from each other by a certain distance partially defining a light receiving region of the photosensor; wherein said photoconductive layer of the photosensor is constructed of two or more laminated layers, and the lower layer positioned nearer to said substrate has a low content of oxygen.

DETAILED DESCRIPTION OF THE PREFERRED EMBODIMENTS

The preferred embodiments of the present invention will now be described.

In the specification, the lowest layer in the photoconductive layer is called an a-Si underlying layer, while one or more layers above the a-Si underlying layer are called merely a-Si layer, respectively where applicable.

Figure 1:
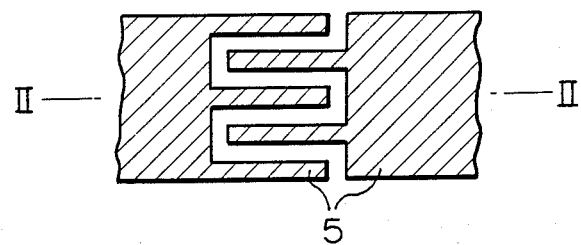
FIG. 1 is a partial plan view showing a photosensor of the photosensor array according to the present invention.
Figure 2:
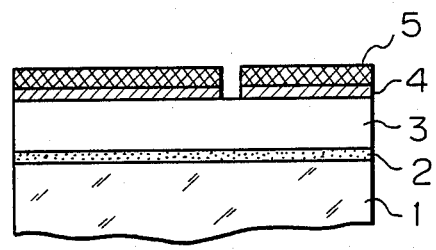
FIG. 2 is a cross section along line II—II of FIG. 1.

FIG. 1 is a partial plan view showing a photosensor of the photosensor array according to an embodiment of the present invention, and FIG. 2 is a cross section along line II—II of FIG. 1. Reference numeral 1 represents a substrate, reference numeral 2 represents an a-Si underlying layer, and reference numeral 3 represents an a-Si layer. These layers constitute the photoconductive layer. Reference numeral 4 represents an ohmic contact layer, and reference numeral 5 represents electrodes through which photocurrent is picked up.

For the material of the substrate 1, glass may be used which includes such as #7059, #7740 manufactured by Corning Co., SCG manufactured by Tokyo Applied Chemistry Co., or silica glass, or ceramics such as partially glazed ceramics may be used.

The photoconductive layer of the photosensor of the photosensor array according to the present invention is constructed of a plurality of laminated layers, each layer having different contents of oxygen. A lower layer (i.e., nearer to the substrate) has a lower content of oxygen than that of a higher layer. The oxygen content of the a-Si underlying layer 2 is preferably less than 2000 atomic ppm, while that of the a-Si layer 3 is preferably between 2000 to 4000 atomic ppm.

The oxygen content of the photoconductive layer has the following functions. Specifically, it is desirable to use a high conductive layer of high oxygen content to obtain a large photocurrent. If a photoconductive layer having a high oxygen content is formed directly on the rough substrate to ensure tight adhesion thereto, the characteristics of photocurrent and dark current may be influenced by locally different roughness of the substrate. On the other hand, if a photoconductive layer having a low oxygen content is used, since it has a low photoconductivity and a low efficiency, the characteristics of photocurrent and dark current are accordingly less influenced by the state of the substrate surface. In view of this, in the present invention, the lower layer uses a relatively low oxygen content layer, whereas the higher layer uses a relatively high oxygen content layer. As a result, it is possible to suppress the influence of the substrate surface state upon the photocurrent throughout the photoconductive layer, and also obtain a large photocurrent.

Too high an oxygen content may cause a substantial deterioration of the photoconductive layer, which is not desirable in practical use. Thus, the oxygen content of the a-Si layer 3 is preferably in the range of 2000 to 4000 atomic ppm, while in contrast the oxygen content of the a-Si underlying layer 2 is preferably in the range of 1 to 2000 atomic ppm.

If the thickness of the a-Si underlying layer is too large, the overall efficiency of the photoconductive layer is lowered. Therefore, according to the present invention, the thickness of the a-Si underlying layer 2 is desired to be not too large, for example, smaller than 1000 angstroms.

The a-Si underlying layer 2 and a-Si layer 3 may be formed using the plasma CVD method, the reactive sputtering method, or the ion plating method, under proper glow discharge conditions, such as discharge power, substrate temperature, material gas composition, and material gas pressure.

The invention will now be described more specifically in connection with Examples.

EXAMPLE 1

A glass substrate (#7059 manufactured by Corning Co.) whose opposite faces have been polished was processed in a mixture liquid of hydrofluoric acid (aqueous solution of 49 volume %), nitric acid (aqueous solution of 60 volume %), and acetic acid, respectively of 1:5:40 by volume ratio Thereafter, the glass substrate 1 was covered with a mask having a desired pattern and set within a capacitive coupling type glow discharge decomposing apparatus to maintain the substrate under pressure of smaller than $1 \times 10^{-6}$ Torr and at 230° C. Next, an $SiH_4$ gas for pure grade epitaxy (manufactured by Komatsu Denshi K.K.) at a flow of 50 SCCM and an $O_2$ gas (99.9999% purity) at a flow rate of 50 ppm relative to the $SiH_4$ gas were introduced into the apparatus, with the gas pressure maintaining at 0.1 Torr. Then a glow discharge was conducted at a radio frequency discharge power of 150 W for 2 minutes using a high frequency (13.56 MHz) power source to form an a-Si underlying layer 2 having a thickness of about 500 angstroms. Next, with an $SiH_4$ gas at a flow of 25 SCCM and an $O_2$ gas at a flow rate of 3000 ppm relative to the $SiH_4$ gas under the gas pressure of 0.08 Torr, a glow discharge was conducted for 4 hours at the discharge power of 20 W to form an a-Si layer 3 having a thickness of about 0.7 microns Next, an $n^+$ ohmic contact layer (about 0.15 micron thickness) was deposited under the discharge power of 30 W using as its material a mixture gas of $SiH_4$ diluted to 10% by $H_2$ and $PH_3$ diluted to 1000 ppm, respectively of 1:5 by mixture ratio. Then, a conductive layer of 0.3 microns was formed by depositing aluminum by means of the electron beam evaporation method.

After forming a photoresist pattern having a desired configuration and made of positive photoresist (OFDR 8000 manufactured by Tokyo Applied Chemistry Co.), the exposed area of the conductive layer was removed to form electrodes 5 using a mixture liquid of phosphoric acid (aqueous solution of 85 volume %), nitric acid (aqueous solution of 60 volume %), glacial acetic acid, and wafer, respectively of 16:1:2:1 by volume ratio. Next, using the plasma etching method and a parallel plate type apparatus, a dry etching was conducted to remove the exposed $n^+$ layer at the radio frequency power of 120 W and at the gas pressure of $CF_4$ of 0.07 Torr. Thus, an $n^{30}$ of a desired pattern was formed, following stripping off the remaining photoresist.

Figure 3:
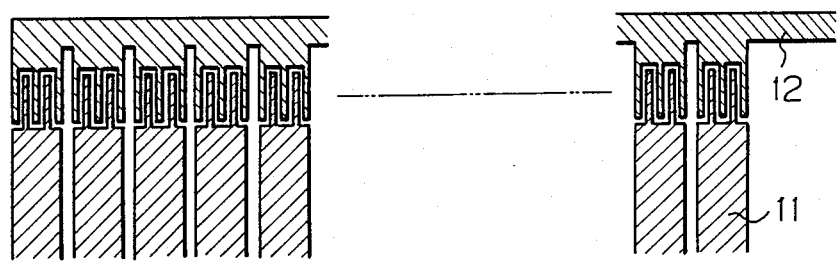
FIG. 3 is a partial plan view showing the photosensor array according to the present invention.

A photosensor array was thus manufactured which has 864 photosensors disposed in an array on a single substrate. The partial plan view of this photosensor array is diagrammatically shown in FIG. 3. In the Figure, reference numeral 11 represents an independent electrode, and reference numeral 12 represents a common electrode. The density of this elongated photosensor array is 8 bit/mm and has a length corresponding to the width of A6 size.

EXAMPLE 2

Figure 4:
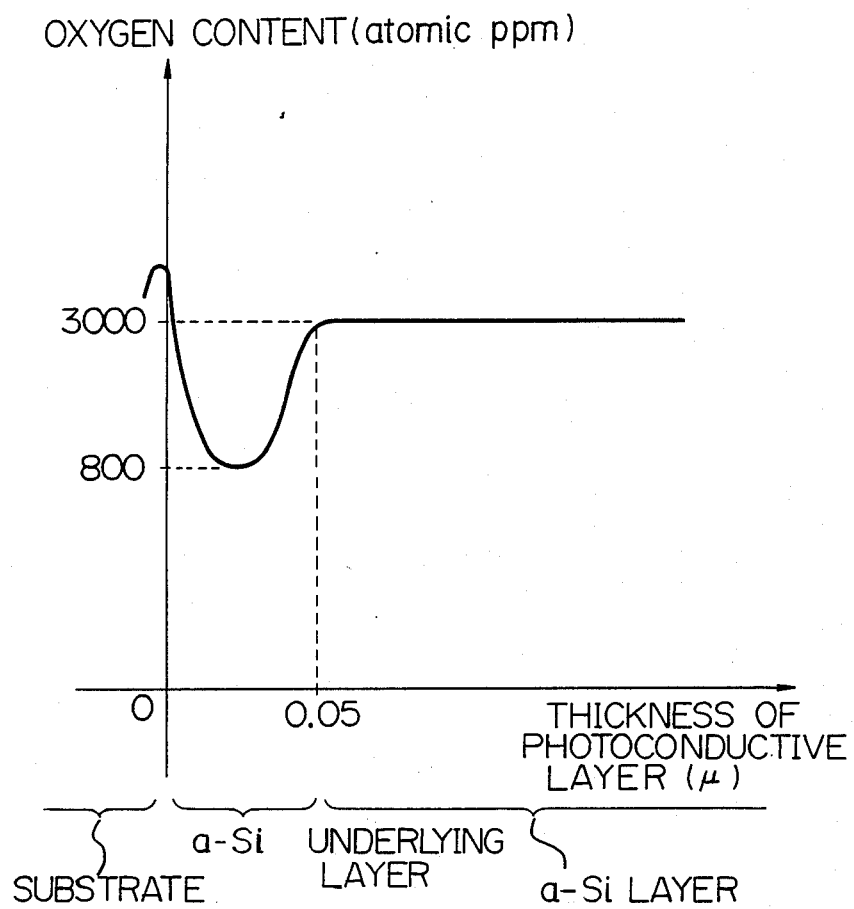
FIG. 4 is a graph showing the content of oxygen in the photoconductive layer.

After an a-Si underlying layer 2 and an a-Si layer 3 were formed on a substrate 1 in a similar manner as of Example 1, the oxygen content of both layers 2 and 3 formed on the substrate were measured using the secondary ion mass spectrometry (SIMS). The results are shown in FIG. 4. As seen from FIG. 4, the oxygen content of the a-Si layer 3 is in the order of 3000 atomic ppm, while that of the a-Si underlying layer 2 is lower than the former. The interface between the a-Si underlying layer 2 and the substrate 1 has the oxygen content higher than 3000 atomic ppm as seen from FIG. 4. This can be considered that the high oxygen content has resulted from the influence of impurity oxygen existing at the interface.

EXAMPLE 3

Figure 5:
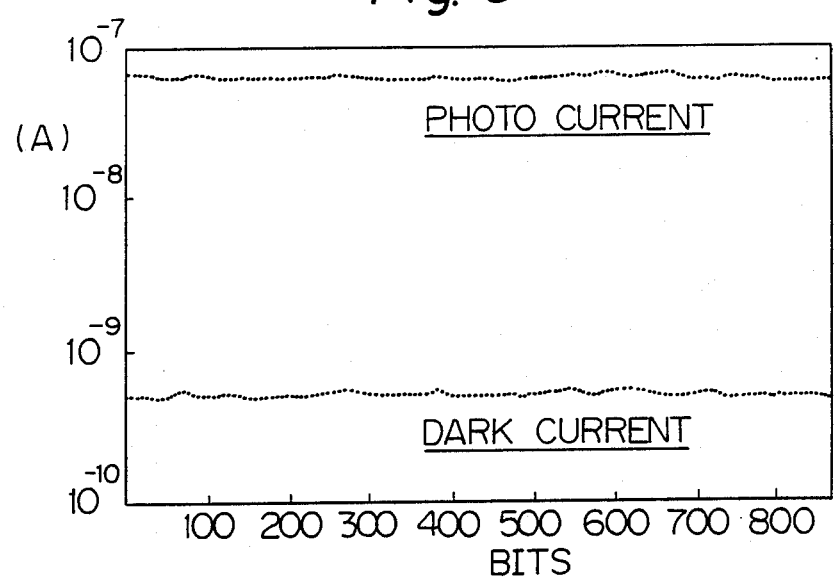
FIGS. 5 and 6 are graphs showing photocurrent and dark current.

The uniformity of photocurrent and dark current between output bits of the photosensor array obtained by Example 1, was measured of which the results are shown in FIG. 5.

For comparison purpose, a photosensor array was manufactured in a similar manner as of example 1 except that the a-Si underlying layer was not formed therein. The uniformity of photocurrent and dark current of this photosensor array was measured the results of which measurement are shown in FIG. 6.

Figure 6:
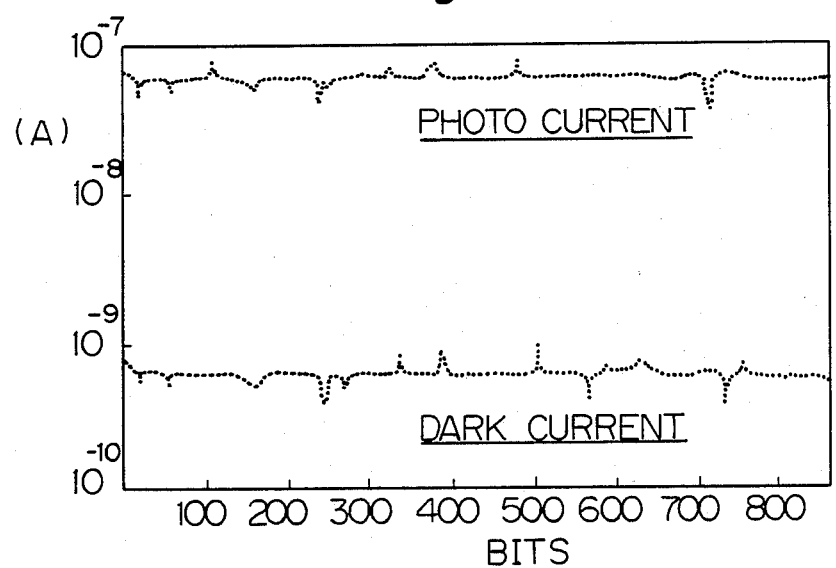

Comparing the results shown in FIGS. 5 and 6, it can be understood that the photosensor array according to this invention has an excellent uniformity in photoconductivity even when a rough substrate is used for ensuring tight adhesion to the photoconductive layer.

Since the characteristics of the photosensor array according to this invention is made uniform, correction circuits are not required even for an elongated photosensor array, thus resulting in a low cost.

We claim:

1. A photosensor array for use with an image processing apparatus and having a plurality of photosensors disposed in an array, each of which photosensors includes:

a substrate, a photoconductive layer formed on said substrate and made of an amorphous silicon, and a pair of electrodes disposed on a surface of the photoconductive layer, the electrodes being spaced apart from each other by a certain distance partially defining a light receiving region of the photosensor;

wherein said photoconductive layer of the photosensor comprises at least two laminated layers, the layer positioned nearer to said substrate having a lower content of oxygen than the other of said layers.

2. A photosensor array for use with an image processing apparatus and having a plurality of photosensors disposed in an array, each of which photosensors includes:

a substrate, a photoconductive layer formed on said substrate and made of an amorphous silicon, and a pair of electrodes disposed on a surface of the photoconductive layer, the electrodes being spaced apart from each other by a certain distance partially defining a light receiving region of the photosensor;

wherein said photoconductive layer of the photosensor comprises at least two laminated layers, the layer positioned nearer to said substrate having a lower content of oxygen than the other of said layers, and wherein the oxygen content of the lowest layer of said photoconductive layer is smaller than 2,000 atomic ppm.

3. A photosensor array for use with an image processing apparatus and having a plurality of photosensors disposed in an array, each of which photosensors includes:

a substrate;

a photoconductive layer formed on said substrate and made of an amorphous silicon, and a pair of electrodes disposed on a surface of the photoconductive layer, the electrodes being spaced apart from each other by a certain distance partially defining a light receiving region of the photosensor;

wherein said photoconductor layer of the photosensor comprises at least two laminated layers, the layer positioned nearer to said substrate having a lower content of oxygen than the other of said layers, and wherein the thickness of the lowest layer of said photoconductive layer is smaller than 1,000 angstroms.

4. A photosensor array for use with an image processing apparatus according to claim 1, wherein
   the oxygen content of the lowest layer of said photoconductive layer is smaller than 2,000 atomic ppm, and thickness of the lowest layer is smaller than 1,000 angstroms.

5. A photosensor array for use with an image processing apparatus according to claim 4, wherein
   maximum oxygen content of the lowest layer of said photoconductive array is 4,000 atomic ppm.

6. A photosensor array for use with an image processing apparatus according to claim 1, wherein
   a surface of the substrate is rough.

7. A photosensor array for use with an image processing apparatus according to claim 1, wherein
   said substrate is glass.

* * * * *

UNITED STATES PATENT AND TRADEMARK OFFICE
CERTIFICATE OF CORRECTION

PATENT NO. : 4,835,507
DATED : May 30, 1989
INVENTOR(S) : SATOSHI ITABASHI, ET AL.

It is certified that error appears in the above-identified patent and that said Letters Patent is hereby corrected as shown below:

COLUMN 2

Line 3, "conventional by" should read --conventional one of--.

COLUMN 3

Line 59, "ratio" should read --ratio.--.

COLUMN 4

Line 11, "0.7 microns" should read --0.7 microns.--.
Line 26, "wafer," should read --water,--.
Line 31, "$n^{30}$" should read --$n^+$--.

COLUMN 6

Line 19, "photoconductor layer" should read --photoconductive layer--.

Signed and Sealed this

Seventh Day of August, 1990

Attest:

HARRY F. MANBECK, JR.

*Attesting Officer*     Commissioner of Patents and Trademarks